(12) United States Patent
Liliental-Weber et al.

(10) Patent No.: US 8,008,181 B2
(45) Date of Patent: Aug. 30, 2011

(54) PROPAGATION OF MISFIT DISLOCATIONS FROM BUFFER/SI INTERFACE INTO SI

(75) Inventors: Zuzanna Liliental-Weber, El Sobrante, CA (US); Rogerio Luis Maltez, Porto Alegre (BR); Hadis Morkoc, Richmond, VA (US); Jinqiao Xie, Raleigh, VA (US)

(73) Assignee: The Regents of The University of California, Oakland, CA (US)

( * ) Notice: Subject to any disclaimer, the term of this patent is extended or adjusted under 35 U.S.C. 154(b) by 136 days.

(21) Appl. No.: 12/540,274

(22) Filed: Aug. 12, 2009

(65) Prior Publication Data

US 2010/0046567 A1     Feb. 25, 2010

Related U.S. Application Data

(60) Provisional application No. 61/091,264, filed on Aug. 22, 2008.

(51) Int. Cl.
*H01L 21/28*     (2006.01)
*H01L 21/3205*   (2006.01)

(52) U.S. Cl. . 438/604; 438/481; 438/514; 257/E33.023; 257/E33.025; 257/E21.085

(58) Field of Classification Search .................. 438/481, 438/514, 604; 257/E33.023, E33.025, E21.085
See application file for complete search history.

(56) References Cited

U.S. PATENT DOCUMENTS 6,657,232 B2   12/2003  Morkoc
7,371,282 B2 *  5/2008  Singh et al. ................ 117/104

OTHER PUBLICATIONS

Liliental-Weber, Z. et al., "Redirecting of misfit dislocations from AlN/Si interface into the substrate", Abstract: A40.00014, 2007 APS March Meeting, Mar. 5, 2007.
Dadgar, A. et al., "Epitaxy of GaN on silicon—impact of symmetry and surface reconstruction", New J. Phys. 9 (2007) 389.
Dadgar, A. et al., "MOVPE growth of GaN on Si(111) substrates", J. Crystal Growth 248 (2003), pp. 556-562.
Krost, A. et al., "In situ monitoring of the stress evolution in growing group-III-nitride layers", J. Crystal Growth 275 (2005) pp. 209-216.
Fang, S. et al., "Gallium arsenide and other compound semiconductors on silicon", Appl. Phys. Rev., 68 (7) R31 Oct. 1, 1990.

(Continued)

*Primary Examiner* — Michelle Estrada
(74) *Attorney, Agent, or Firm* — Weaver Austin Villeneuve & Sampson LLP

(57) ABSTRACT

Misfit dislocations are redirected from the buffer/Si interface and propagated to the Si substrate due to the formation of bubbles in the substrate. The buffer layer growth process is generally a thermal process that also accomplishes annealing of the Si substrate so that bubbles of the implanted ion species are formed in the Si at an appropriate distance from the buffer/Si interface so that the bubbles will not migrate to the Si surface during annealing, but are close enough to the interface so that a strain field around the bubbles will be sensed by dislocations at the buffer/Si interface and dislocations are attracted by the strain field caused by the bubbles and move into the Si substrate instead of into the buffer epi-layer. Fabrication of improved integrated devices based on GaN and Si, such as continuous wave (CW) lasers and light emitting diodes, at reduced cost is thereby enabled.

8 Claims, 11 Drawing Sheets

OTHER PUBLICATIONS

Sakai, A. et al., "Defect structure in selectively grown GaN films with low threading dislocation density", Appl. Phys. Lett. 71, (16), 2259, Oct. 20, 1997.

Liliental-Weber, Z. et al., "TEM study of defects in laterally overgrown GaN layers", MRS Internet J. Nitride Semicond. Res. Res. 4S1 (1998) G4.6.

Liliental-Weber, Z. et al., "Microstructure of laterally overgrown GaN layers", J. Appl. Phys. 89 (12), 7833, Jun. 15, 2001.

Zheleva, T. et al., "Pendeo-Epitaxy: A new approach for lateral growth of gallium nitride films", J. Elect. Mat. 28 (4) 1999, Nov. 12, 1998.

Fini, P. et al., "Maskless lateral epitaxial overgrowth of GaN on sapphire", Mater. Res. Soc. Symp. Proc. 572, (1999) 315.

Davis, R.F. et al., "Pendeo-epitaxial growth of thin films of gallium nitride and related materials and their characterization", J. Crystal Growth 225, (2001) pp. 134-140.

Trinkaus, H. et al., "Strain relaxation mechanism for hydrogen-implanted $Si_{1-x}Ge_x/Si(100)$ heterostrusctures", Appl. Phys. Lett. 76 (24), 3552, Jun. 12, 2000.

Luysberg, M. et al., "Effect of helium ion implantation and annealing on the relaxation behavior of pseudomorphic $Si_{1-x}Ge_x$ buffer layers on Si (100) substrates", J. Appl. Phys., 92 (8) 4290, Oct. 15, 2002.

Reinhardt, Karen A. et al., "Handbook of silicon wafer cleaning technology", $2^{nd}$ edition, Elsevier Science & Technology Book, Jan. 2008, ISBN-13: 9780815515548, 1.4 "Overview of wafer cleaning and surface conditioning technology", pp. 21-29.

Miller, N. et al., "Low-temperature grown compositionally graded InGaN films", Phys Stat. Sol (C), vol. 5, No. 6, 1866-1869, (2008), Sep. 15, 2007.

Wei-Kan Chu et al., "Backscattering Spectrometry", Academic Press Inc., New York, 1978.

Fichtner, P.F.P. et al., "Nucleation and growth of platelet bubble structures in He implanted silicon", Nucl. Instr. And Meth. In Phys. Res., B 136-138 (1998) 460.

Ziegler, J.F. et al., "The Stopping and Range of Ions in Solids", Pergamon Press, Oxford, 1985, vol. 1.

Semond, F. et al., "GaN grown on Si(111) substrate: From two-dimensional growth to quantum well assessment", Appl. Phys. Lett. 75 (1999) 82, Jul. 5, 1999.

Chu, W.K. et al., "Rutherford backscattering spectrometry: reminiscences and progresses", Materials Chemistry and Physics 46 (1996) 183-188.

Liliental-Weber et al., 2007 APS March Meeting, Session A40: Semiconductors: Growth of Nitrides, conference presentation slides: Redirecting of misfit dislocations from AlN/Si interface into the substrate, Mar. 5, 2007.

Maltez et al., "GaN/AlN/Si(111) Heteroepitaxy on He Ion implanted Si(111) Substrates—RBS/C studies", Universidade Federal Do Rio Grande Do Sol, IBMM 08, Dresden, Germany, conference presentation slides, Sep. 25-27, 2007.

Liliental-Weber et al., "Propagation of misfit dislocations from AlN/Si interface into Si", Journal of Crystal Growth 310 (2008) 3917-3923, Jun. 7, 2008.

Liliental-Weber et al., "Propagation of misfit dislocations from AlN/Si interface into Si", Conference presentation slides, Sep. 25-27, 2007.

* cited by examiner

PROPAGATION OF MISFIT DISLOCATIONS FROM BUFFER/SI INTERFACE INTO SI

CROSS-REFERENCE TO RELATED APPLICATION

This application claims priority to U.S. Provisional Patent Application No. 61/091,264, entitled "PROPAGATION OF MISFIT DISLOCATIONS FROM BUFFER/SI INTERFACE INTO SI," which was filed on Aug. 22, 2008 and which is hereby incorporated by reference in its entirety.

STATEMENT OF GOVERNMENTAL SUPPORT

The invention described and claimed herein was made at least in part utilizing funds supplied by AFOSR GRANT No: AFOSRISSAO7NE001 through the U.S. Department of Energy under Contract No. DE-AC02-05CH11231. The Government has certain rights in this invention.

BACKGROUND OF THE INVENTION

Epitaxial growth of GaN on Si substrates has recently gained increased interest since such a system presents possibilities for novel integrated devices based on GaN and Si [1-3] at reduced cost. This is particularly the case for LEDs which are traditionally low cost items and are required in large numbers to meet demand in display and lighting applications. Such a system would provide the potential for utilizing the strength of GaN in conjunction with advanced Si technology and abundance for effective and economical integrated device structures. However, the large misfit between GaN and Si (14% between a-axes), growth of a polar crystal on non-polar substrates and the difference in thermal expansion coefficients lead to a high density of lattice defects and antiphase disorder as observed in GaAs grown on Si [4]. Due to a lack and/or prohibitively high cost of native substrates for growth of GaN, this material needs to be grown on foreign substrates such as $Al_2O_3$ or SiC. Therefore, different approaches need to be applied, such as lateral overgrowth and pendeo-epitaxy, to reduce defect density in the epi-layer [5-10].

Reduction of strain at the interface leads to a lower defect density. Earlier results [11-12] show that H and He implantation through a pseudomorphic Si—Ge layer grown on (100) Si substrates below critical layer thickness and subsequent annealing at 850° C. leads to complete strain relaxation and defect free Si—Ge layers in comparison with unimplanted samples. The genesis of defect-free growth lies in the fact that implantation energy was chosen to create end of range defects slightly below Si—Ge/Si interface (50-100 nm). The H or He bubbles are formed in Si following annealing. A much denser arrangement of tangled misfit dislocations was found at the interface between the $Si_{1-x}Ge_x$ (x=22% -30%) and Si substrates in comparison with regularly distributed misfit dislocations grown on un-implanted Si, where only 50% relaxation was obtained upon annealing at 1100° C. A model was proposed [11] for strain relaxation due to the formation of dislocation loops in the vicinity of He bubbles that annihilate with threading dislocations at high temperature when the loops become glissile and can glide toward the SiGe interface. It has been proposed that one side of the loop is pinned at the interface where it forms a strain relieving misfit segment. The other side is driven by the mismatch stress to the surface, where an atomic step is generated. In the case of GaN however, pseudomorphic growth on Si is impossible due to the lattice misfit being too large.

Different approaches are therefore needed to permit epitaxial growth of GaN on Si substrates without threading dislocations since pseudomorhic growth of GaN on Si is impossible due to large lattice and thermal expansion mismatch.

SUMMARY OF THE INVENTION

The present invention provides an avenue to reduce defects in GaN (or other III-Nitride based on GaN, such as InGaN or AlGaN) grown on Si as well providing a pathway to adapt GaN technology to mature Si processing technology for improved GaN-based device fabrication. A Si substrate is implanted an ionic species capable upon annealing of forming bubbles stable to the processing conditions of the device fabrication method. In a specific embodiment, He is the implanted species, although others, such as H or Ne, or their combinations with He by multiple implantations, are also possible.

After the implantation, the Si surface is cleaned using conditions that do not cause dissipation of the implanted ions or bubbles formed therefrom to the Si substrate surface. Such a cleaning procedure does not involve a high temperature (e.g., greater than 1000° C.) hydrogen anneal in the growth chamber following a chemical clean to ensure complete removal of any surface oxides prior to epitaxial growth. Cleaning in accordance with the present invention is conducted at a relatively low temperature, below 300° C., for example, about 80° C., or even room temperature. A RCA standard clean process variant, described further below, has been found to be suitable. In accordance with the present invention, such a wet chemical cleaning process, has been found to provide suitable wafer cleaning for high quality epitaxial growth of GaN on Si without the need for a high temperature anneal of the Si substrate in the growth chamber.

A GaN/Si interfacial buffer layer is then grown on the cleaned Si substrate so that a buffer/Si interface is formed. A common GaN/Si interfacial buffer layer material is AlN, although other materials that promote adherence of the GaN to the Si may alternatively be used. The buffer layer growth process is generally a thermal process that also accomplishes annealing of the Si substrate so that bubbles of the implanted ion species are formed in the Si at an appropriate distance from the buffer/Si interface so that the bubbles will not migrate to the Si surface during annealing, but are close enough to the interface so that a strain field around the bubbles will be sensed by dislocations at the buffer/Si interface and dislocations are attracted by the strain field caused by the bubbles and move into the Si substrate instead of into the buffer epi-layer. A layer of AlN followed by GaN (or other III-Nitride based on GaN, such as InGaN or AlGaN) is then grown on the buffer layer.

The growth of the interfacial buffer and GaN (or other III-Nitride based on GaN, such as InGaN or AlGaN) layers can be accomplished by any suitable technique. Molecular Beam Epitaxy (MBE) is a suitable technique for accomplishing the relatively low temperature growth required for the He implantation embodiment of the invention. Metal-Organic Chemical Vapor Deposition (MOCVD) may be a suitable technique where low processing temperatures are not required, such as when Ne is implanted. Another suitable low temperature film growth technique applicable to the present invention is Energetic Neutral Atomic-Beam Lithography/Epitaxy (ENABLE).

In a specific embodiment, He is implanted into the Si substrate with appropriate implant conditions. The implant conditions are selected to guide the implanted ions to concentrate about 100-250 nm, or preferably 120-200 nm, for example about 120 nm, from the Si substrate surface. Implantation energy of about 15-30 KeV and fluences of 1 or $2\times10^{16}$ cm$^{-2}$ can produce acceptable implant results. After the implantation, the Si surface is cleaned using an RCA standard cleaning procedure, followed by dipping of Si samples in diluted HF solution and immediately loading into a growth chamber, without using an elevated temperature (not exceeding 300° C.) at any stage of the cleaning. Generally, a temperature as close as possible to room temperature, or about 80° C. as in the RCA standard clean can be used. Importantly, the cleaning procedure does not involve a high temperature anneal, such as has been used in the growth chamber to ensure removal of any surface oxide contaminants prior to epitaxial growth.

Since the thermal stability of the He bubbles is relatively low, this low temperature cleaning technique is important to achieve the beneficial results according to this embodiment of the invention. Then, an AlN buffer layer is formed on the Si substrate at a relatively low temperature of about 380-750° C., for example 680-720° C. Simultaneously this AlN growth temperature also serves to anneal the implanted Si substrate. At this temperature, the implanted He ions coalesce into He bubbles at a specific distance from the Si substrate surface (being determined by the implantation fluence and energy) such that misfit dislocations formed at the AlN/Si interface can interact with strain field formed around the He bubbles. Under these conditions, the He bubbles form neither too close nor too far from the Si surface, in which case they could either dissipate to the surface or be too far from the newly formed misfit dislocations for their strain fields to interact with them, respectively. The dislocations thus primarily move into the Si substrate (as threading dislocations) instead of into the AlN epi-layer. Finally, the GaN layer of interest is grown on the AlN surface. Molecular Beam Epitaxy (MBE) is a suitable technique for accomplishing the relatively low temperature growth required for this embodiment of the invention.

In accordance with the invention, since the strain due to the lattice mismatch has been substantially dissipated by the misfit dislocations directed into the Si substrate, the GaN growth layer can grow with a substantial decrease of structural defects. In this way, strain relaxation at the buffer/Si interface can lead to the formation of larger grains than those observed in the GaN/AlN layers grown on un-implanted Si under the same conditions. Some dislocations will still likely remain in the GaN/AlN layer mainly due to the difference between the thermal expansion coefficient between Si and the layers grown on top of it, but with much lower density than for the growth on un-implanted Si. The distribution of the remaining dislocations in the AlN/GaN layers is uniform throughout the wafer, as opposed to laterally or pendeo-epitaxially overgrown layers, which are also able to decrease defect density in GaN grown on foreign substrates. In the present approach, however, the devices can be uniformly distributed.

The invention enables fabrication of improved integrated devices based on GaN (or other III-Nitride like InGaN or AlGaN) grown on Si, such as continuous wave (CW) lasers and light emitting diodes, at reduced cost.

DETAILED DESCRIPTION OF SPECIFIC EMBODIMENTS

Figure 1A:
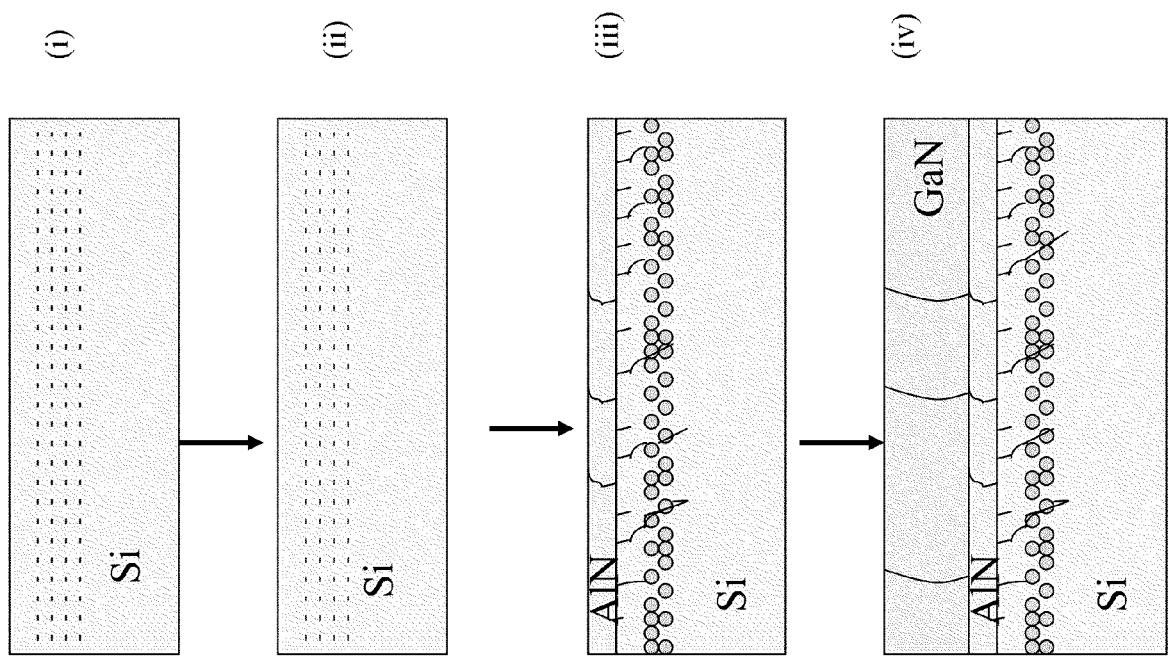
FIG. 1(a) is a schematic illustration of a process of fabricating a GaN semiconductor device substrate in accordance with a specific embodiment of the present invention in which He is the implanted ion, and the resulting GaN semiconductor device substrate; (b) For comparison, a process of fabricating AlN/GaN on unimplanted Si and expected defect distribution in a GaN layer.

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims.

In the following description, numerous specific details are set forth in order to provide a thorough understanding of the present invention. The present invention may be practiced without some or all of these specific details. In other instances, well known process operations have not been described in detail so as to not unnecessarily obscure the present invention.

Introduction

As noted above, the present invention provides a way to combine GaN technology with abundantly available Si substrates and mature Si processing technology for improved GaN-based device fabrication. A Si substrate is implanted an ionic species capable upon annealing of forming bubbles stable to the processing conditions of the device fabrication method. In a specific embodiment, He is the implanted species, although others, such as H or Ne (or other elements from group VIII) are also possible. For the case of Ne, and heavier implanted ions, the implants may be performed with the sample heated in order to avoid the substrate amorphization. After the implantation, the Si surface is cleaned using conditions that do not cause dissipation of the implanted ions or bubbles formed therefrom to the Si substrate surface. In the case of He, the cleaning is conducted at a relatively low temperature; below 300° C.; preferably room temperature.

A GaN/Si interfacial buffer layer is then grown on the cleaned Si substrate so that a buffer/Si interface is formed. A common GaN/Si buffer layer material is Al/N, although other materials that promote adherence/nucleation of the GaN to the Si may alternatively be used. The buffer layer growth process is generally a thermal process that also accomplishes annealing of the Si substrate so that bubbles of the implanted ion species are formed in the Si at an appropriate distance from the buffer/Si interface so that the bubbles will not migrate to the Si surface during annealing, but are close enough to the interface so that a strain field around the bubbles will be sensed by dislocations at the buffer/Si interface and dislocations are attracted by the strain field caused by the bubbles and move into the Si substrate instead of into the buffer epi-layer. A layer of GaN (or other III-Nitride based on GaN, such as InGaN or AlGaN) is then grown on the buffer layer.

The growth of the buffer and GaN-based layers any be accomplished by any suitable technique. Molecular Beam Epitaxy (MBE) is a suitable technique for accomplishing the relatively low temperature growth required for the He implantation embodiment of the invention. Metal-Organic Chemical Vapor Deposition (MOCVD) may be a suitable technique where low processing temperatures are not required, such as when H or Ne (or other elements from column VIII) are implanted. Another suitable low temperature film growth technique applicable to the present invention is Energetic Neutral Atomic-Beam Lithography/Epitaxy (ENABLE); this technique is described by Miller et al. [14], the disclosure of which in this regard is incorporated herein by reference.

In accordance with the invention, since the strain due to the lattice mismatch has been substantially dissipated by the misfit dislocations directed into the Si substrate, the GaN growth layer can grow with a substantial decrease of structural defects. In this way, strain relaxation at the buffer/Si interface can lead to the formation of larger grains than those observed in the GaN/AlN layers grown on un-implanted Si under the same conditions. Some dislocations will still likely remain in the GaN/AlN layer mainly due to the difference between the thermal expansion coefficient between Si and the layers grown on top of it. However, the distribution of the remaining dislocations in the AlN/GaN layers is uniform throughout the wafer, as opposed to laterally or pendeo-epitaxially overgrown layers, which are also able to decrease defect density in GaN (or other III-Nitrides based on GaN, such as InGaN or AlGaN) grown on foreign substrates. Therefore, in the present approach, the devices can be uniformly distributed.

He Implantation Embodiment

In a specific embodiment, He is implanted into the Si substrate with appropriate implant conditions. The implant conditions are selected to guide the implanted ions to concentrate about 100-250 nm, or preferably 120-200 nm, for example about 120 nm, from the Si substrate surface. Implantation energy of about 15-30 KeV and a fluence of 1 or $2 \times 10^{16}$ cm$^{-2}$ can produce acceptable implant results.

After the implantation, the Si surface is cleaned using conditions that do not cause dissipation of the implanted ions or bubbles formed therefrom to the Si substrate surface. Such a cleaning procedure does not involve a high temperature (e.g., greater than 800° C., such as about 1000° C.) hydrogen anneal, such has been performed in the growth chamber to ensure removal of any surface oxides remaining following a chemical clean. Cleaning in accordance with the present invention is conducted at a relatively low temperature, below 300° C., for example, about 80° C., or even room temperature. A RCA standard clean process [13], generally conducted at about 80° C., followed by dipping of Si samples in diluted HF solution and immediately loading into the growth chamber has been found to be suitable. In accordance with the present invention, this wet chemical cleaning process has been found to provide suitable wafer cleaning for high quality epitaxial growth of GaN on Si without the need for a high temperature anneal of the Si substrate in the growth chamber.

Since the thermal stability of the He bubbles is within 350-750° C., this low temperature cleaning technique is important to achieve the beneficial results according to this embodiment of the invention.

Then, an AlN buffer layer is formed on the Si substrate at a relatively low temperature of about 380-750° C., for example 680° C. Simultaneously this AlN growth temperature also serves to anneal the implanted Si substrate. At this temperature, the implanted He ions coalesce into He bubbles at a specific distance from the Si substrate surface (being determined by the implantation fluence and energy) such that misfit dislocations formed at the AlN/Si interface can interact with strain field formed around the He bubbles. Under these conditions, the He bubbles form neither too close nor too far from the Si surface, in which case they could either dissipate to the surface or be too far from the newly formed misfit dislocations for their strain fields to interact with them, respectively. The dislocations thus primarily move into the Si substrate (as threading dislocations) instead of into the AlN epi-layer.

Finally, the GaN layer of interest (or other III-Nitrides such as InGaN or AlGaN) is grown on the AlN surface. Molecular Beam Epitaxy (MBE) is a suitable technique for accomplishing the relatively low temperature growth required for this embodiment of the invention.

The beneficial result is thus achieved by appropriate control of the He fluence, distance of He bubbles from the Si surface and thermal parameters of the cleaning procedure of the Si before AlN growth and annealing during AlN growth.

As depicted in FIG. 1(a)(i), a Si substrate is implanted with He with appropriate implant conditions. The implant conditions are selected so that the implanted ions are concentrated about 100-250 nm from the Si substrate surface, or preferably 120-200 nm, for example about 120 nm, from the Si substrate surface. Implantation energy of about 15-30 KeV and a fluence (dose) of 1 or $2 \times 10^{16}$ cm$^{-2}$ can produce acceptable implant results.

After the implantation, the Si surface is cleaned without using an elevated temperature (FIG. 1a(ii)), such as by an RCA standard cleaning process, which is conducted at a temperature of about 80° C., without a thermal anneal. This low temperature cleaning technique is important to achieve the beneficial results according to this embodiment of the invention.

Then, an AlN layer is grown on the Si substrate at a relatively low temperature of about 380-750° C., or about 680-720° C., for example about 680° C. (FIG. 1a(iii)). This AlN growth temperature is also used as an annealing temperature for the implanted Si substrate. At this temperature, the implanted He ions coalesce into He bubbles at a distance from the Si substrate surface determined by the implantation fluence and energy. At this distance, misfit dislocations formed at the AlN/Si interface can interact with the strain field formed around the He bubbles. The dislocations thus primarily move into the Si substrate instead of into the AlN epi-layer.

Finally, a GaN film is grown on the AlN surface (FIG. 1a(iv)). Since the strain of the lattice and thermal mismatch have been decreased by the misfit dislocations directed into the Si substrate, the GaN growth layer can be grown with much better structural quality in comparison with the AlN/GaN grown on unimplanted Si using the same conditions (compare to FIG. 1b, described below). A growth temperature of GaN not exceeding 750° C. provides good results. Higher GaN growth temperatures (e.g., up to 1000-1100° C.) are also possible without adversely affecting the fabrication as long as that the growth of AlN was below 750° C.

In this way, strain relaxation at the AlN/Si interface can lead to structural improvement of the GaN/AlN layers grown on foreign substrates.

It has been found that the implant, cleaning and anneal conditions are important to achieving the desired result for this He implantation embodiment. The implant should be conducted so that the bubbles which subsequently form during AlN growth/annealing are created not so close to the Si surface that they migrate to the surface during annealing, but not so far (about 100-250 nm) that they will not be felt by the strain field of misfit dislocation formed at the Si/AlN interface. The Si surface cleaning should be conducted at a relatively low temperature (as close as possible to room temperature and not exceeding 300° C.), such as with a wet chemical RCA standard clean, and without a high temperature anneal in the growth chamber for residual oxide removal. The AlN growth temperature (and also annealing temperature of implanted Si allowing formation of He bubbles) should be as close as possible to 600° C. and not exceeding 750° C., again rather than the typical 1000° C. The GaN growth temperature may be 750° C. or below; but growth at the more typical 1000-1100° C. temperature is also possible without adverse effects.

Growth can be conducted using Molecular Beam Epitaxy (MBE), as described herein, or any other suitable technique that can operate in the required temperature regimes described herein (e.g., ENABLE).

The invention enables fabrication of improved integrated devices based on GaN (or other III-Nitrides) grown on Si, such as continuous wave lasers and light emitting diodes, as well as paving the way to produce GaN based devices such as LEDs, LLEDs (laser light emitting diodes) or solar cells at reduced cost.

Figure 1B:
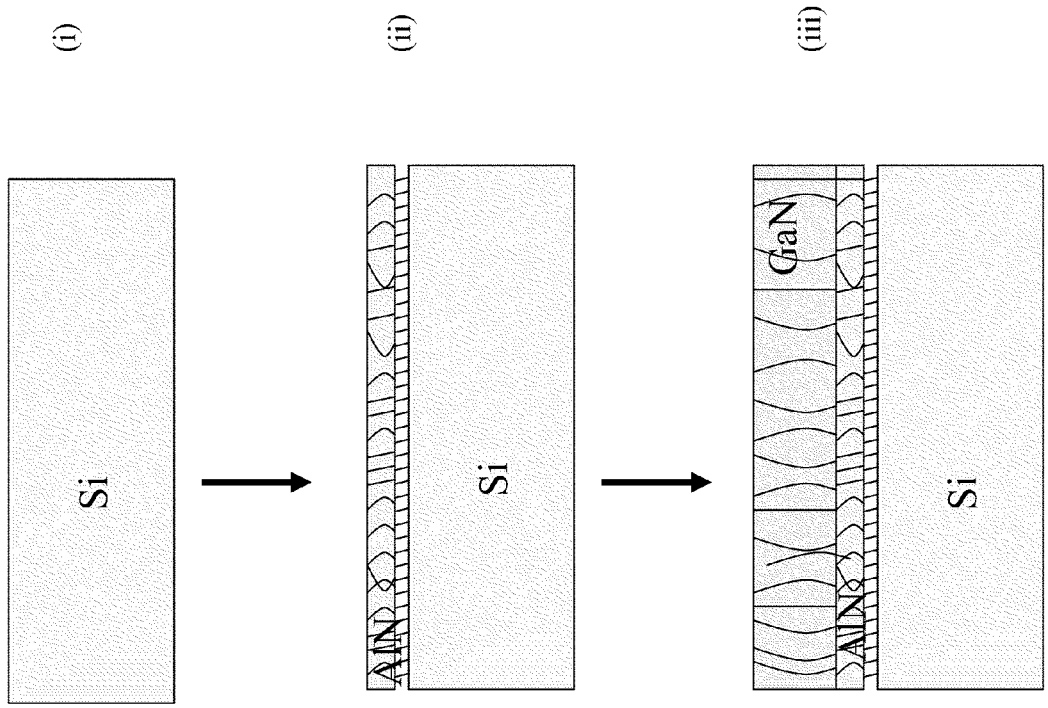

For purposes of comparison, FIG. 1b illustrates the AlN/GaN grown on unimplanted Si using the same conditions. The unimplanted Si (FIG. 1b(i)) is the substrate for AlN buffer growth. Misfit dislocations are formed at the AlN/Si interface and threading dislocations propagate into the AlN layer (FIG. 1b(ii)). Threading dislocations further propagate into the GaN layer when it is grown on the AlN buffer layer ((FIG. 1b(iii)). This is an unacceptable semiconductor device substrate.

EXAMPLES

The following examples provide details illustrating process specifics, advantageous properties and/or applications in accordance with certain embodiments of the present invention. These examples are provided to exemplify and more clearly illustrate aspects of these embodiments of the invention and are in no way intended to be limiting.

Rutherford Backscattering Spectrometry (RBS) and Transmission Electron Microscopy (TEM) were used to determine at which temperature the He bubbles were formed and how their presence influenced the structural perfection of the GaN. For comparison GaN/AlN layers were also grown on un-implanted Si substrates.

Implantation Conditions

Bare Si ($\bar{1}$ 11) samples were implanted with 15 and 30 keV of He ions up to fluences of 0.5, 1 and $2 \times 10^{16}$ cm$^{-2}$. The 30 keV implantation was used only up to the fluence of $1 \times 10^{16}$ cm$^{-2}$. In order to change the distance of the He bubbles from the Si surface some samples with an additional 50 nm of SiO$_2$ deposited on ($\bar{1}$ 11) Si sample were implanted with He at 15 keV and fluence of $1 \times 10^{16}$ cm$^{-2}$. After implantation, the SiO$_2$ cap layer was removed by etching in an HF:H$_2$O (1:2) solution leaving the He profile shallower in comparison to the samples where bare Si was used. This alternative procedure was employed since an implantation energy lower than 15 keV was not available. In order to grow the SiO$_2$ cap layer, Si was submitted to a controlled furnace annealing under a flux of high purity dry O$_2$. All implantations were performed at room temperature using a 500 kV ion implanter. In order to detect the presence of He bubbles and their depth below the Si surface, implanted samples were subjected to Rapid Thermal Annealing (RTA) for 120 s at different temperatures ranging from 350 to 1000° C. under N$_2$ flux. All samples were analyzed by Rutherford Backscattering Spectrometry (RBS), under random incidence and also aligned to the [$\bar{1}$ 11] sample direction (channeling normal to the surface). The measurements were carried out with a 1.2 MeV He$^+$ beam produced by a 3 MeV Tandem accelerator at Porto Alegre, Brazil.

RBS/Channeling Studies

All samples were characterized by RBS aligned along the [$\bar{1}$ 11] Si crystallographic direction at which channeling can be obtained. Channeling is a special phenomenon observed in crystals, which allows the incoming beam of α particles to penetrate through the interstitial positions and to be parallel to the low-index crystallographic directions of the sample [15]. In our RBS measurement a 1.2 MeV He+ beam impinged toward the sample surface and was collected by a detector placed at a fixed angular position. The signal generated in the detector was amplified and processed by a Multichannel Analyzer (MCA), where there is a linear relationship between the MCA channel number and α particle energy. Particles backscattered from deeper in the sample will lose more energy due to their longer penetration depth and will produce counts at lower MCA channel numbers, representing lower energies.

The sample is mounted on a goniometer with a precision better than 0.1°. When the beam is aligned with the low-index axial direction of a single-crystal, the counts decrease to 2-5% compared to the value registered for a random atom distribution (a non-crystallographic direction, similar to that observed for an amorphous sample). Such a spectrum can be obtained by tilting the sample 3-4° from the aligned angular position, at which maximum counts can be obtained (see non-aligned spectrum in FIG. 2).

Results from RBS/Channeling Measurements

The RBS/channeling measurements were performed on the implanted samples after annealing for 120 s (FIGS. 2) in order to determine the best condition for He bubble formation in our samples. It has been observed earlier [16] that the presence of the over-pressurized bubbles results in a strong dechanneling of the incoming beam of α particles at the depth of bubble formation. This can be a consequence of the stress generated by the bubbles and the small distortion in the crystal since channeling effect is very sensitive to crystal imperfections [15].

Figure 2:
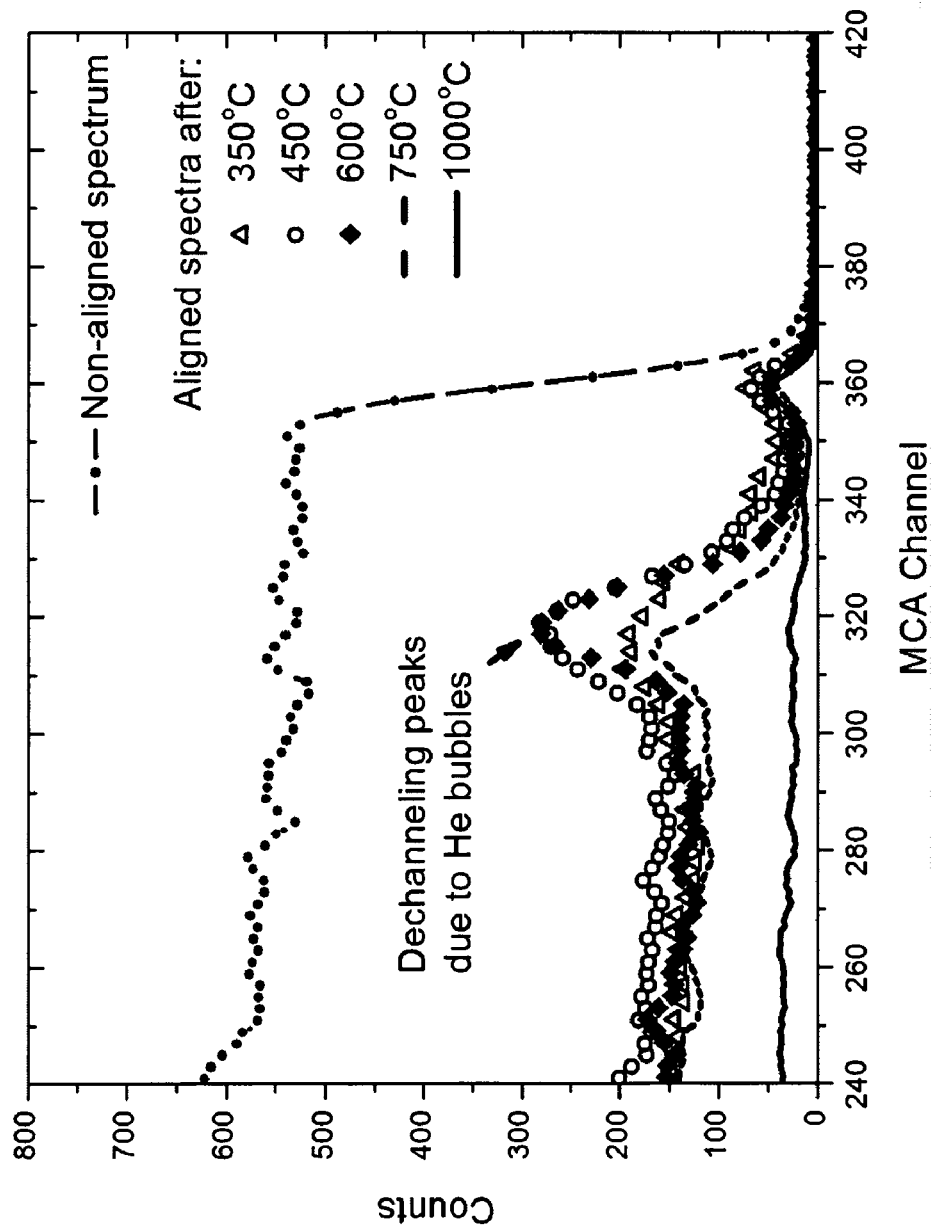
FIG. 2 is a plot showing results of channeling measurements performed on Si implanted with 15 keV of He ions, up to a fluence of $1\times10^{16}$ He/cm$^2$, after RTA annealing for 120 s at different temperatures: 350° C. (open triangles), 450° C. (open circles), 600° C. (full diamonds), 750° C. (dashed lines), 1000° C. (solid line).

FIG. 2 shows the spectra from the sample implanted with 15 keV He ions and a fluence of $1 \times 10^{16}$ He/cm$^2$, annealed at five different temperatures in the range of 350-1000° C. For comparison, a spectrum obtained in a non-aligned condition is also shown. Each aligned spectrum shows a small peak observed about the MCA number 360, which is due to scattering from Si atoms at the sample surface. The surface peak is characteristic in channeled spectra and corresponds to the outermost atoms seen by the beam. However, at lower MCA channel numbers (about 315) a well-pronounced peak is observed (except in the 1000° C. spectrum). Our calculations, based on a surface energy approximation [15] and an estimation of stopping powers for a random target [17], shows that the peak position corresponds to beam scattering from a depth of approximately 130 nm, indicating the formation of He bubbles at this depth due to annealing.

Our results (FIG. 2) show that bubbles start to form at the low annealing temperature of 350° C. (open triangles). The maximum dechanneling is already obtained after annealing at 450° C. (open circles) and stays unchanged up to about 600° C. (full diamonds). This would be consistent with a thermal behavior associated with a bubble coalescence regime, where they increase in size leading to a smaller crystal distortion. At 750° C. (dashed lines) a smaller dechanneling is observed indicating bubble dissolution and annihilation. At the highest annealing temperature (1000° C.—solid line), the He implanted Si has completely recovered its original crystalline quality and the spectrum shows the lowest counts for all depths. These results provide the evidence that He bubbles are formed in Si (111) at a low temperature (450-600° C.). It was concluded that the growth temperature needs to be kept at around 600° C. in order to use the advantage of the stress field around the bubbles to attract the interfacial dislocations. We also showed that the duration of annealing at a particular temperature does not change the spectra, indicating the growth temperature is the main parameter. We also observed that deeper implantation obtained at 30 keV implantation energy is more thermally stable against bubble annihilation, probably due to the longer distance required for He atoms to diffuse to the sample surface.

Figure 3:
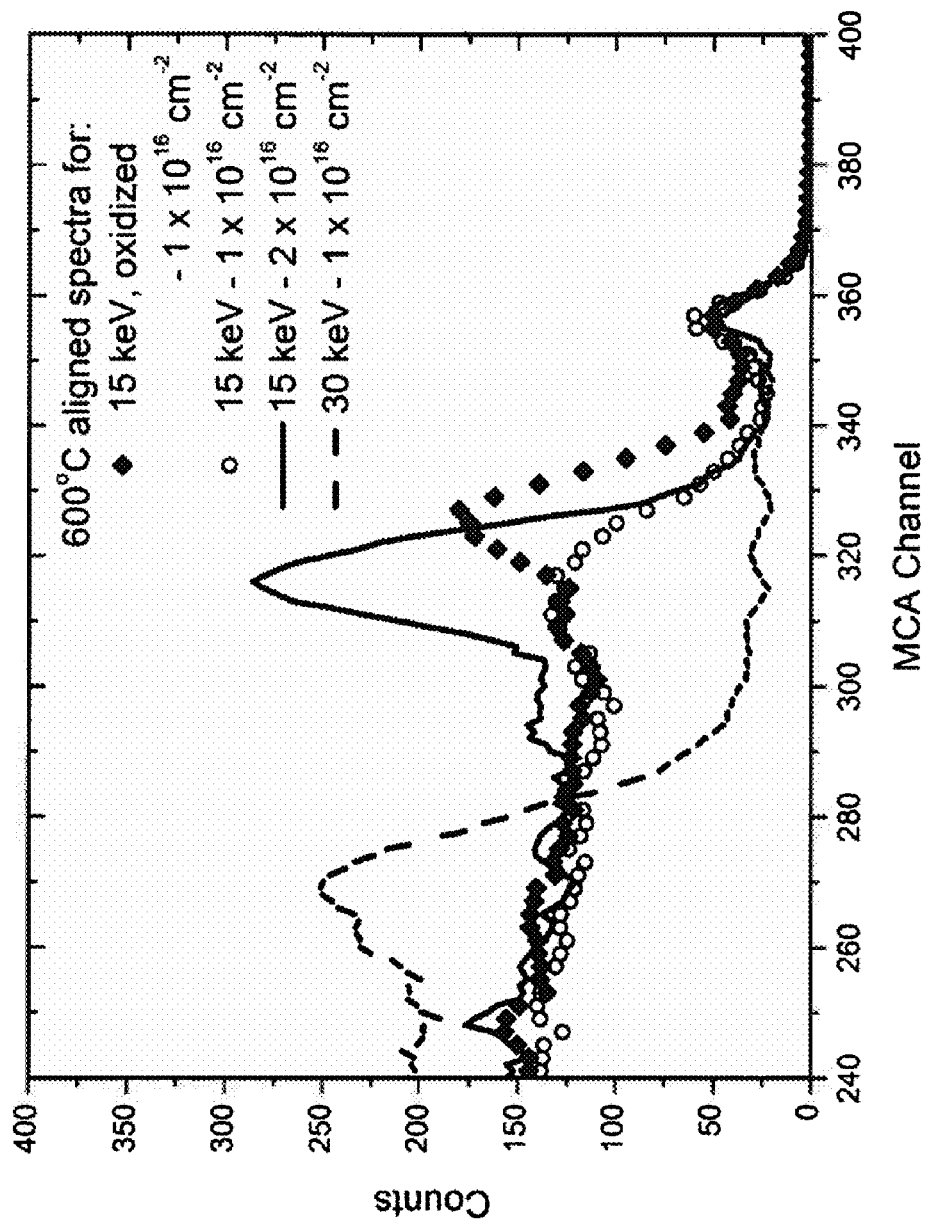
FIG. 3 is a plot showing channeling spectra after 600° C. RTA annealing (rapid thermal annealing) for 120 sec for the Si samples implanted with different energies: 15 keV through a 50 nm SiO$_2$ cap (full diamond), 15 keV (open circles), and 30 keV (dashed line). All samples were implanted with $1\times10^{16}$ He/cm$^2$. For comparison the Si sample implanted with 15 keV up to the fluence of $2\times10^{16}$ He/cm$^2$ is shown as the solid line.

FIG. 3 shows the spectra obtained from the sample annealed at 600° C. in order to observe the change with implantation energy and fluence. When the implantation energy is changed from 15 keV to 30 keV, the He dechanneling peak shifts from the MCA channel 315 to 268, respectively. For the 15 keV implantation through a 50 nm SiO$_2$ cap the peak is at about channel 326 (full diamond), while for the non-caped samples (open circles—$1 \times 10^{16}$ He/cm$^2$ or solid line—$2 \times 10^{16}$ He/cm$^2$) the MCA channel is at about 315. These peak positions correspond to depths of the He bubbles of about 90 nm, 130 nm and 270 nm from the sample surface, respectively. It will be shown later that these estimated values agree fairly well with those observed experimentally by TEM. One should notice a higher dechanneling peak for the 30 keV case (dashed line), as compared to the 15 keV case with the same fluence (open circles—$1 \times 10^{16}$ cm$^{-2}$). This might indicate that the sample with bubbles located farther from the surface retained more implanted He indicating lower out-diffusion. However, when the 15 keV oxidized sample (full diamond) is compared with the 15 keV un-oxidized one (open circles—$1 \times 10^{16}$ cm$^{-2}$), the indication is that the shallowest implantation has retained more He. This can be explained by the fact that the SiO$_2$ cap also reduces the He out-diffusion during implantation. However, TEM studies showed that that He bubbles were formed too close to the Si surface and during the growth of AlN they diffused to the Si surface, therefore, did not serve as the sink for attraction of dislocations (see TEM data and discussion below).

FIG. 3 also indicates that dechanneling is increasing with the implantation fluence and the highest dechanneling peak is observed for 15 keV up to a fluence of $2 \times 10^{16}$ cm$^{-2}$ (solid line).

These results demonstrate that the bubble stress field on the sample surface can be tailored by changing the implantation conditions and we can tailor the bubble stress field over the Si surface.

Growth Procedure

Molecular Beam Epitaxy (MBE) was used for the growth of GaN/AlN/Si layers. An MBE system having RF nitrogen plasma as the Nitrogen source was used. One Infinite cell manufactured by RJM Semiconductors for Ga source and two Addon cells were used for Al source.

Si substrates were first cleaned in acetone, followed by methanol, DI water, and aqua regia before loading to the growth chamber (called here cleaning procedure I). Since the Si wafer is very easy oxidized and it was believed that thin oxide contamination on the wafer surface would result during transfer to the growth chamber, detrimentally affecting epitaxial GaN growth. Therefore, cleaning procedure I further included a hydrogen annealing performed for 3 min at 1020° C. in the chamber to remove the surface oxide and obtain 7×7 surface reconstruction for clean Si before the growth.

The AlN buffer layer was grown at a temperature slightly above 600° C. followed by the growth of GaN at temperature 50° C. higher than the buffer layer. The relatively lower operating temperature regime of the MBE technique as compared to the case of more typically used MOCVD for GaN substrate fabrication is beneficial for maintaining the He bubbles, which have a thermal stability limit of about 750° C. We also grew slightly thicker AlN layers and GaN/AlN on un-implanted and implanted <111> Si substrates using the cleaning procedure I.

As noted above, the typical cleaning procedure (I), involves an annealing process at high temperature (above 1000° C.) used to remove the surface oxide and obtain 7×7 surface reconstruction for clean Si before the growth. However, RBS results suggest using a growth temperature as close as possible to 600° C. and not exceeding 750° C. to retain He bubbles. Therefore, we also explored a different cleaning procedure (II), not previously used in this context due, at least in part, to the concern about oxide contamination of the Si wafer surface during transfer to the growth chamber. A RCA wet chemical cleaning process [13] was used, followed by dipping of Si samples in diluted HF (about 8-10%, e.g., 10 wt. %) solution and immediately loading into the MBE system growth chamber.

The RCA standard clean involves the application of two consecutively applied hot solutions known, SC-1 and SC-2, featuring pure and volatile reagents. The SC-1 solution for the first processing step is a mixture of $NH_4OH$ (ammonium hydroxide), $H_2O_2$ (peroxide) and $H_2O$; also known as "APM" for "ammonia/peroxide mixture." The SC-2 solution for the second processing step is a mixture of HCl (hydrochloric acid), $H_2O_2$ and $H_2O$; also known as "HPM" for "hydrochloric/peroxide mixture." A typical composition for the SC-1 solution ranges from 5:1:1 to 7:2:1 parts by volume of: $H_2O$: $H_2O_2$:$NH_4OH$. A typical composition for the SC-2 solution ranges from 6:1:1 to 8:2:1 parts by volume of $H_2O$:$H_2O_2$: HCl. The exact compositions for both solutions are not critical for proper performance; the recommended proportions are reliable and simple to prepare and use. Cleaning in either mixture is carried out at about 75-85° C. (e.g., about 80° C.) for about 10-20 minutes followed by a quench and overflow rinse in running DI $H_2O$.

The same N, Ga and Al sources were used. There was no additional high temperature thermal treatment [18] of the Si substrates before the growth. To achieve a uniform temperature distribution, the wafers were supported only by thin Mo wires to avoid any hard thermal contact between the substrate and the Mo holder used for affixing the sample during growth to the heater assembly. The AlN buffer layer was grown at the same temperature followed by growth of GaN at a temperature 20° C. higher than in the previous MBE growth. The GaN layers were grown under a Ga rich condition and the growth rate was limited by the nitrogen flux. During the growth, reflection high-energy electron diffraction (RHEED) was used to monitor the surface condition.

TEM Studies

Characterization of GaN grown on implanted and un-implanted Si substrates was performed by TEM using a JEOL 3010 transmission electron microscope. Since the RBS results shown in FIGS. 2-3 suggest highest dechanneling at 600° C., and decreasing (but still observable) at 750° C., we used the Molecular Beam Epitaxy (MBE) growth method instead of the more conventional MOCVD technique, since the lower growth temperature can be more easily applied. We were aware that the quality of the layer can suffer due to utilization of a low growth temperature, but a compromise was attempted to meet the objective of redirecting misfit dislocations from the interface to the substrate. AlN layers were grown slightly above 600° C. with a thickness of about 30 nm thick followed by a 1 μm thick GaN layer grown at a 50-70° C. higher temperature than used for the buffer layer. Si wafers were cleaned by the same procedure I. Annealing of the substrates prior to growth was not used. Samples with two different implantation energies (15 keV and 30 keV) and same fluence ($1\times10^{16}$ He $cm^{-2}$) were studied. In addition, the same structures were grown on un-implanted Si using the same growth and substrate cleaning procedure.

Figure 4:
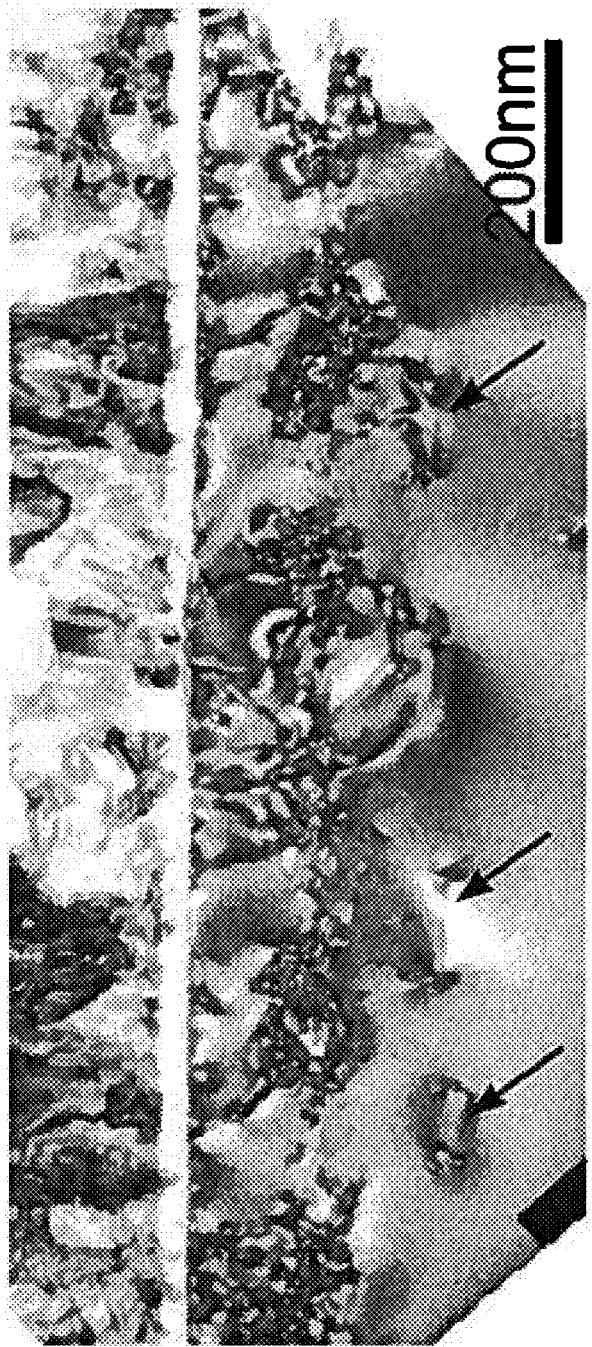
FIG. 4 depicts a cross-section TEM micrograph of GaN/AlN grown on He implanted Si (15 keV and fluence of $1\times10^{16}$ cm$^{-2}$; the He bubbles are about 120 nm from the interface). An interaction of misfit dislocations with the strain field (and possible dislocation loops) formed around the He bubbles is visible. End-of-range defects are indicated by arrows.
Figure 5:
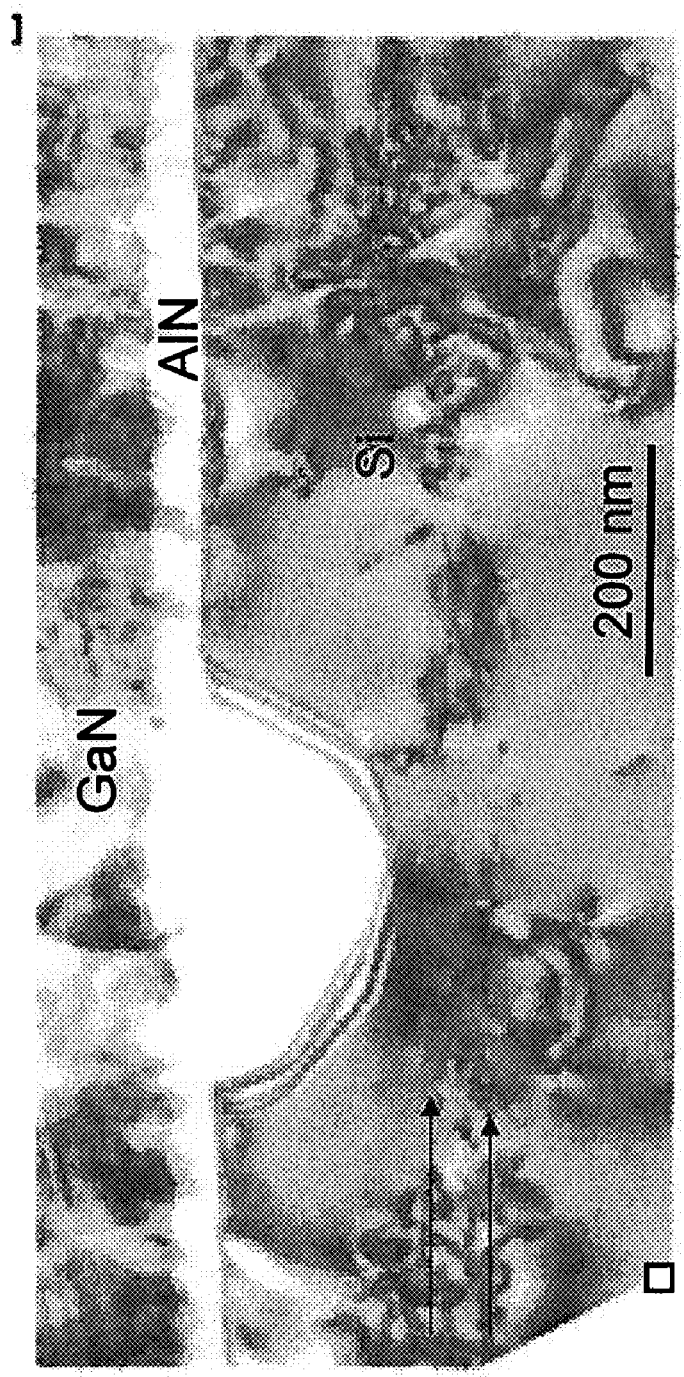
FIG. 5 depicts a higher magnification image of a portion of the micrograph of FIG. 4 showing the area close to a void formed at the interface. Note the lack of misfit dislocation interaction in this area. Arrows outline a band of He bubbles.

The first GaN layer about 1030 nm thick was grown on 30-40 nm thick AlN on top of an implanted (15 keV and fluence $1\times10^{16}$ $cm^{-2}$) Si substrate (FIG. 4). The measured distance from the interface to the He bubbles, based on TEM micrographs, was 120 nm, close to the nominal value of 130 nm determined by RBS. In this sample, misfit dislocations interacted with the strain field created in the vicinity of many He bubbles and these dislocations propagated further into the substrate. End-of range defects in the form of dislocation loops formed due to implantation were also clearly observed. There are also some areas of the samples where large voids are formed at the interface (FIG. 5). Any interaction with dislocation loops in the vicinity of such a void was not observed.

Figure 6:
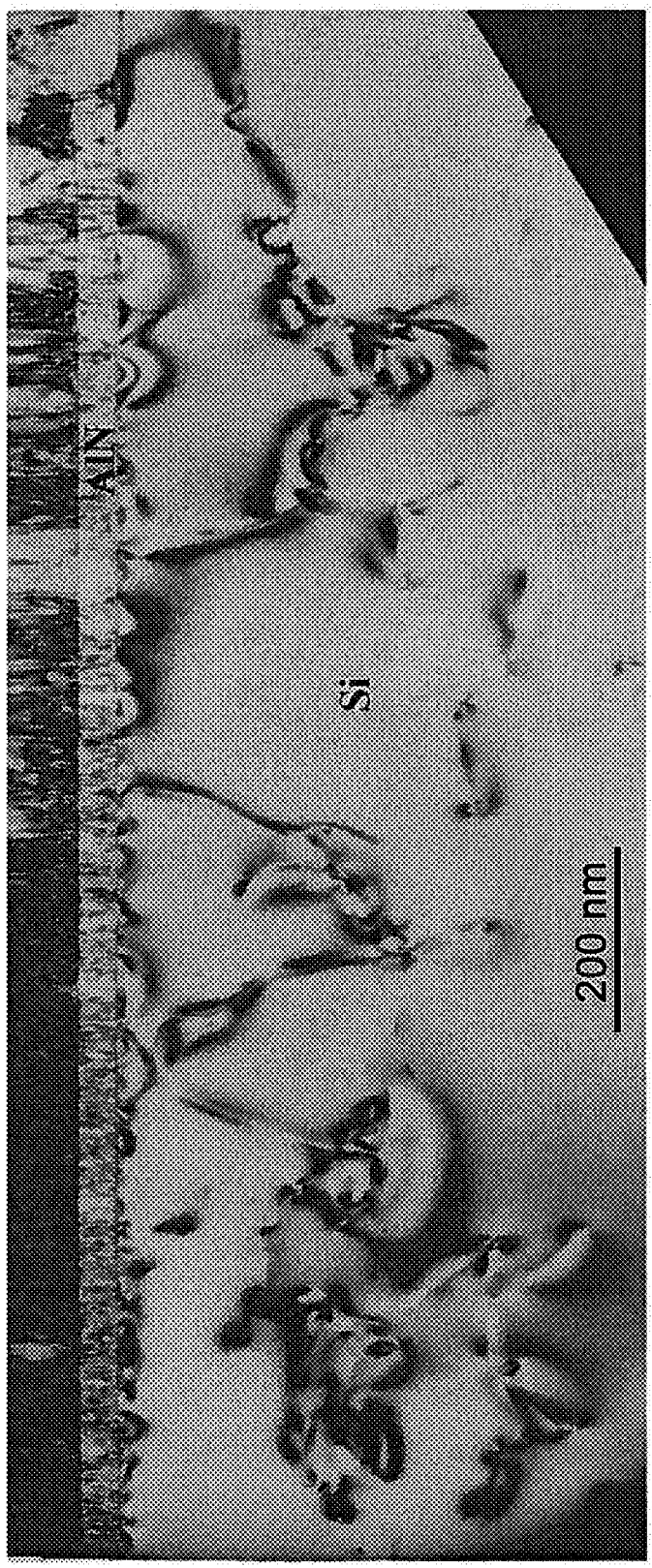
FIG. 6 depicts a cross-section micrograph from the GaN/AlN layers grown on implanted Si substrate (30 keV and fluence of $1\times10^{16}$ cm$^{-2}$) showing misfit dislocations redirected into the Si substrate. Some dislocations propagated farther into the Si substrate (beyond the end-of-range defects).

A higher implantation energy (30 keV) and fluence ($1\times10^{16}$ $cm^{-2}$) (FIG. 6) was also studied. The GaN layer (about 1050 nm thick) was grown on 40 nm thick AlN on top of an implanted Si substrate. The distance from the interface to the He bubbles in this case was about 240 nm, close to the value of 270 nm determined by RBS. Only a narrow band with He bubbles was observed in this area of the Si substrate. In this sample some misfit dislocations interacted with the strain field around the bubbles and propagated deep to the substrate where end of range defects are formed and beyond. However, the distance between the dislocations that propagated from the interface to the Si substrate was much larger (200-400 nm) than in the sample with a lower fluence and shorter distance from the Si surface. It is most likely that the He bubbles are formed too deep in the substrate and the strain field around them is not large enough to interact with misfit dislocations formed at the interface with the AlN buffer layer. Dislocation density in the GaN layer was rather large ($9\times10^{11}$ $cm^{-2}$).

Samples that were implanted (15 keV and fluence of $1\times10^{16}$ $cm^{-2}$) through the $SiO_2$ cap layers (removed before the growth), where He bubbles are formed at the depth of 70 nm did not show strong interaction with the misfit dislocations since many elongated voids were present at the interface with the AlN buffer layer. From these studies it was clear that there is only a narrow range of distances for which interaction with misfit dislocations is possible. It was also observed that despite many misfit dislocations being "pushed" back to the Si substrate the GaN layer quality did not improve. It was clear that this low growth temperature was one of the parameters determining the GaN quality. The second parameter, that we also considered was the cleaning procedure, since the traditionally used annealing procedure for oxide removal could be not applied in this case.

Figure 7:
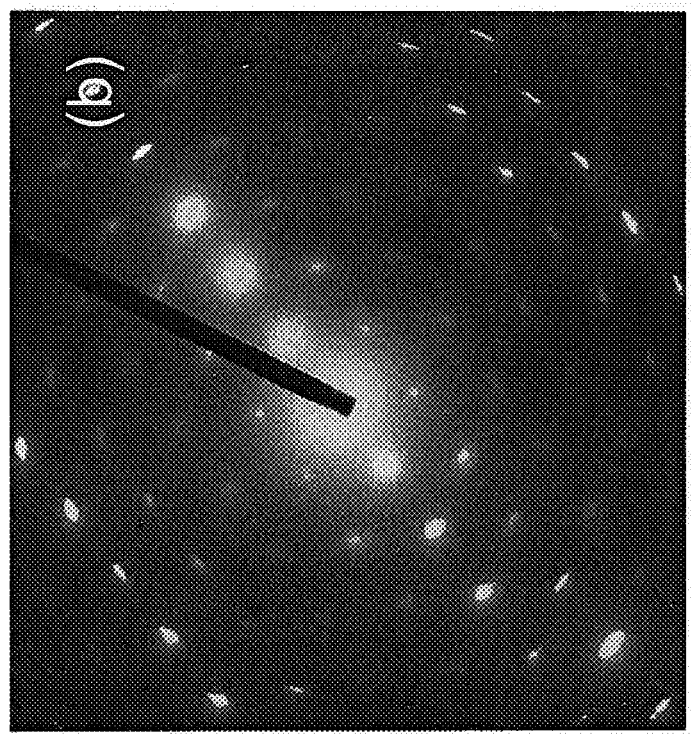
FIG. 7 depicts electron diffraction patterns of GaN grown on un-implanted (a) and implanted (b) Si substrate cleaned using a procedure in accordance with the invention, described herein ($1\times10^{16}$ cm$^{-2}$ He).
Figure 7:
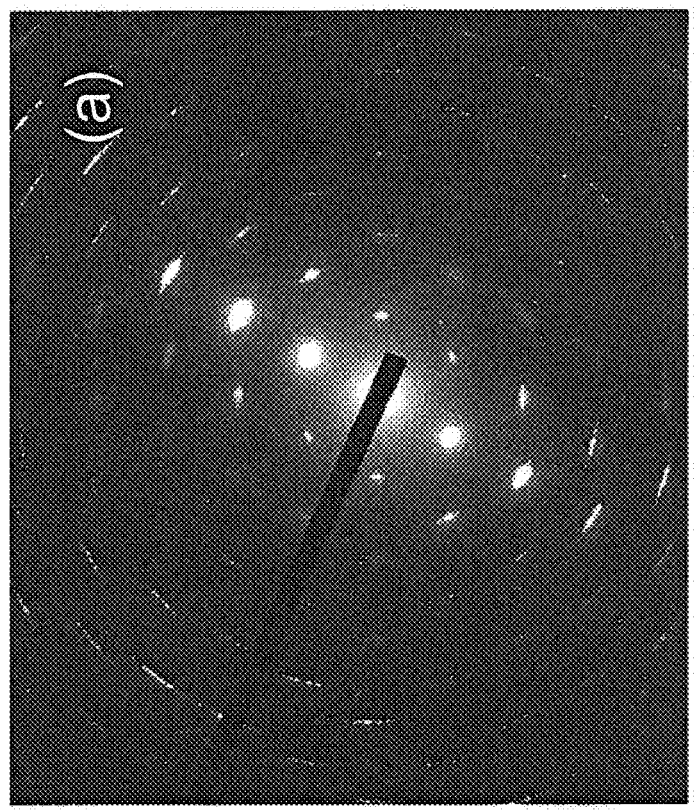
Figure 8:
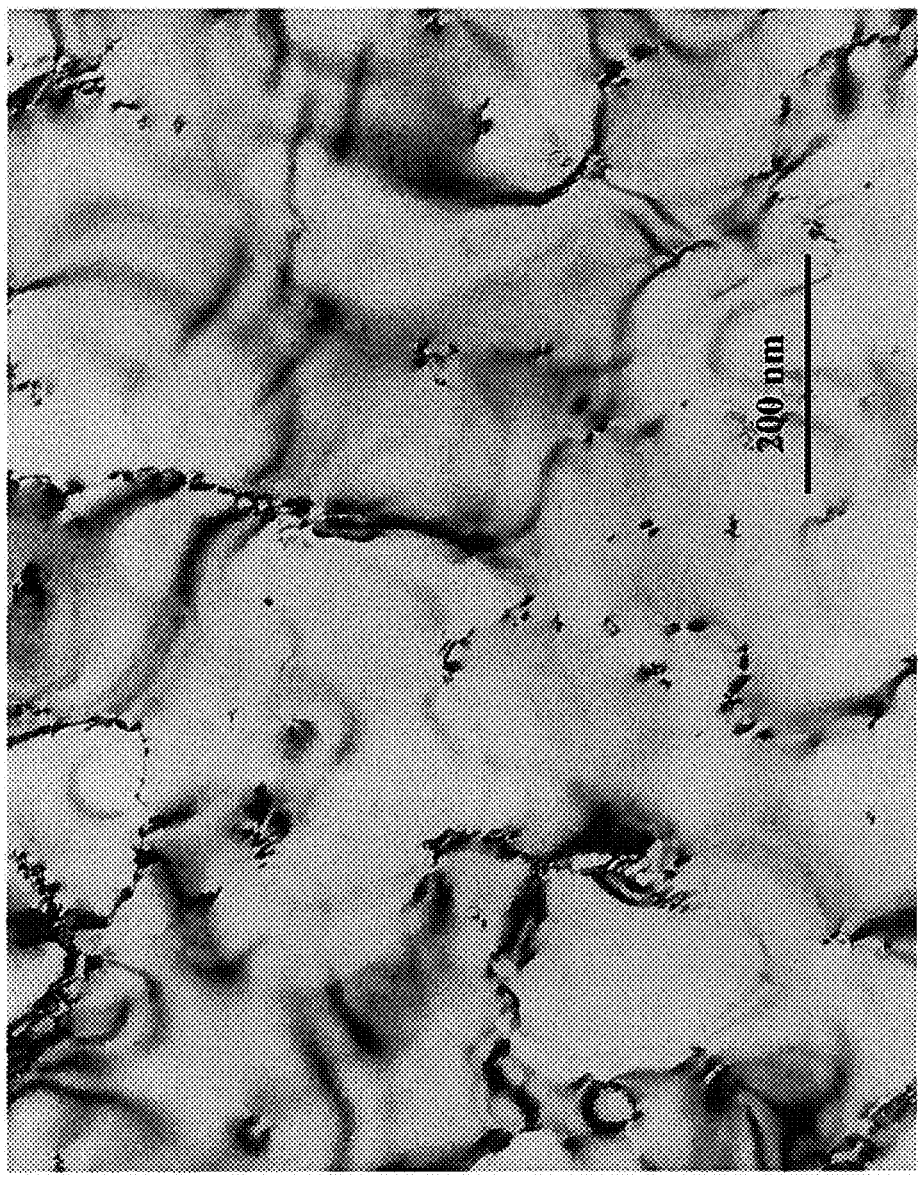
FIG. 8 is a plan-view micrograph of GaN grown on He-implanted ($1\times10^{16}$ cm$^{-2}$) Si substrates (with AlN buffer layer) showing large grain diameter. The subgrain diameter (with dislocations on grain boundaries) is more than 1000 nm.
Figure 9:
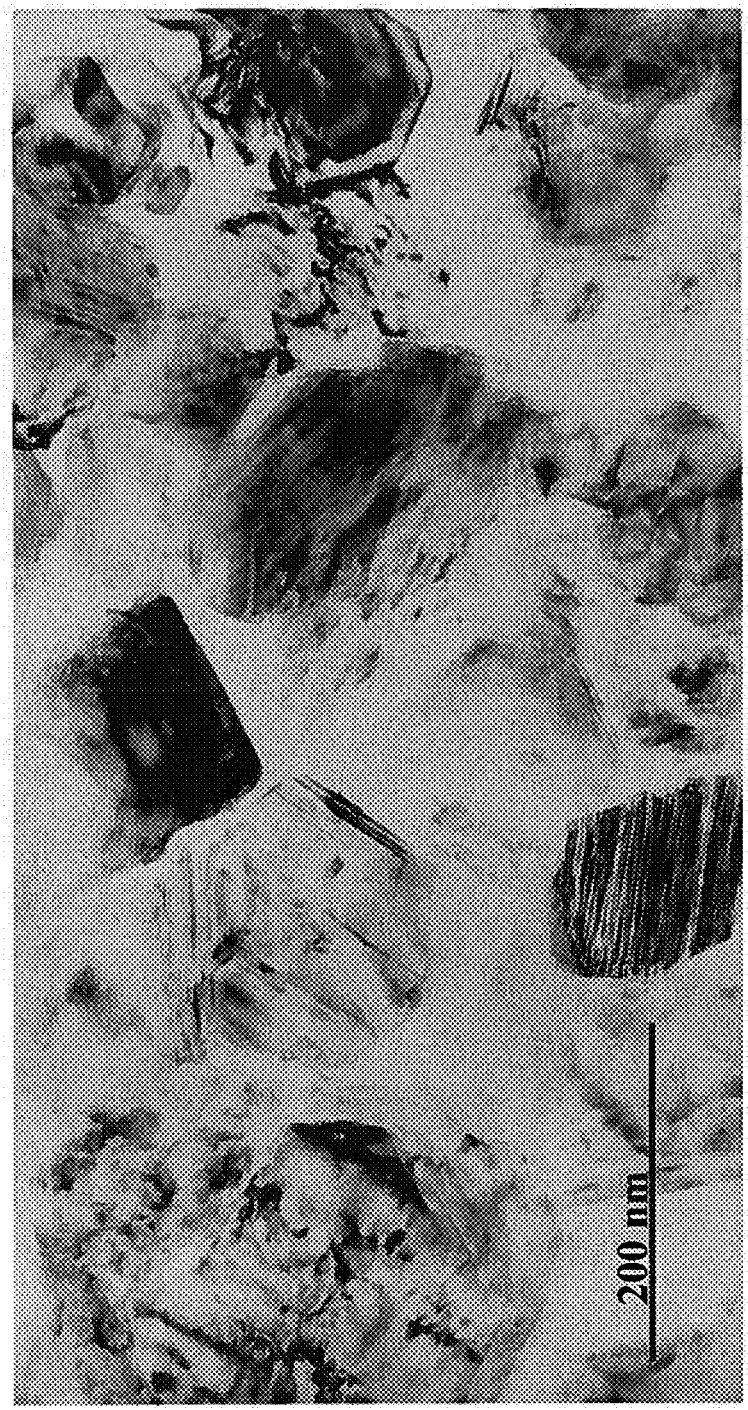
FIG. 9 is a plan-view micrograph from the GaN layer grown on un-implanted Si (with AlN buffer layer) taken with multi-beam conditions to observe all grains in contrast. Growth conditions and cleaning procedure II were the same for the growth on the implanted (FIG. 8) and un-implanted (FIG. 9) Si.
Figure 10:
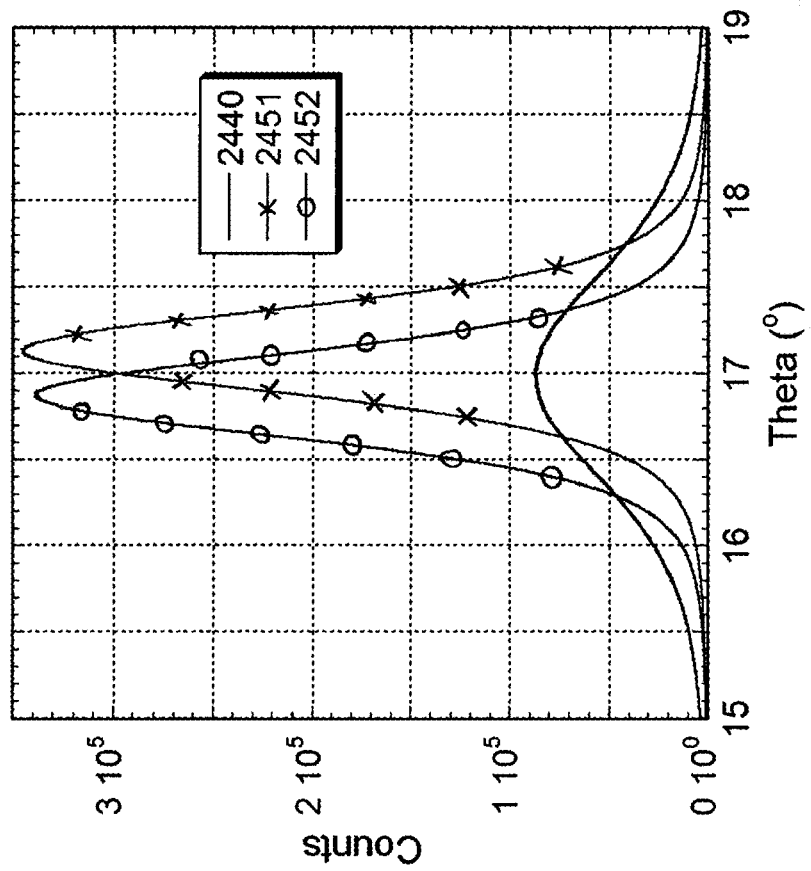
FIG. 10 depicts X-ray rocking curves comparing implanted (two different implantation energies—for sample number #2541-15 keV and $1\times10^{16}$ cm$^{-2}$; #2452-30 keV and $1\times10^{16}$ cm$^{-2}$) and non-implanted sample #2440.The line intensity and FWHM (full width at half maximum) give information about sample quality. It can be seen that line intensity is about 4 times higher with 3× narrower FWHM for implanted samples. This clearly suggests structural quality improvement with application of the inventive method.

To check the reproducibility of the results a new set of GaN/AlN/Si samples was grown in the same MBE system using the cleaning procedure II, in accordance with the present invention. Cross-section and plan-view samples were studied by TEM. Diffraction patterns and bright field micrographs prepared from plan-view samples show a drastic difference in the structural quality of these samples. Diffraction patterns (FIGS. 7a and 7b) show a much higher arcing of the diffraction spots from the samples grown on un-implanted Si, suggesting smaller grains and misorientation between them (FIG. 7a). This arcing is practically negligible in the samples grown on implanted substrates and single crystal pattern is observed (FIG. 7b). This substantial improvement in the structural quality of the GaN layer is confirmed by images taken from these layers grown on the implanted and un-implanted substrates (FIGS. 8 and 9). The size of the grains for the layers grown on implanted Si (FIG. 8) was many times larger (with diameter larger than 1000 nm) than for the growth on un-implanted Si (FIG. 9). The size of the GaN grains for the samples grown on un-implanted Si was in the range of 40-150 nm. A large misorientation between these grains was also observed.

To assess the structural quality of the larger areas of these samples 0002 x-ray rocking curves were measured on the GaN samples grown on Si implanted with 15 keV and 30 keV with the fluence of $1\times10^{16}$ $cm^{-2}$. For comparison the measurements were also performed on the GaN layer grown on un-implanted Si, where Si surface cleaning II and growth procedure was identical to the previous two samples. The intensity of x-ray rocking curves for both samples grown on implanted Si is 4 times higher and FWHM (full with at half maximum) is about 3 times narrower in comparison to the samples grown on un-implanted Si. One can notice that the intensity of the x-ray rocking curve obtained for the sample implanted with 15 keV is still slightly higher in comparison with the sample grown on the Si substrate implanted with higher energy. This is in agreement with the TEM data that stronger interaction with misfit dislocations was observed for the sample implanted with lower energy, which facilitated He bubbles formation closer to the Si surface. This study showed that the substantial improvement in structural quality was obtained following the procedure described in this invention. Because the lattice mismatch and difference in thermal expansion coefficient between Si and GaN (and also AlN) is so large, a complete removal of threading dislocations is practically impossible, but the quality of the GaN layers obtained by application of this growth procedure is remarkably high and comparable to the structural perfection of GaN grown on $Al_2O_3$.

Summary

For the first time, it has been shown that misfit dislocations formed at the GaN/AlN/Si interface can interact with a strain field formed around He bubbles created in He implanted Si which allow redirecting of the misfit dislocations into the Si substrate instead of the epi-layer. It was found that an implantation fluence of $(1\times10^{16}$ $cm^{-2})$ at 15 keV, which forms He bubbles 120 nm from the interface, gave the best results. Too small or too large a distance of the bubbles from the interface does not lead to the desired interaction with misfit dislocations formed during the growth of AlN buffer layer. Placement of bubbles further from the interface at 240 nm (keeping the same implantation fluence) still works, but the density of redirected dislocations is smaller. This study also showed that in order to form He bubbles, a low growth temperature for the AlN layer is required. Pretreatment of the Si surface at high temperatures in order to get a 7×7 reconstruction (a proof of a clean surface) cannot be used because He bubbles diffuse to the interface and do not produces a strain field dislocation loops around them to attract interfacial dislocations.

This study also shows that in order to improve structural quality (in addition to redirecting the dislocations to the substrate) the proper cleaning procedure of the Si substrate and a well-defined growth temperature (a temperature at which He bubbles do not propagate to the substrate surface) needs to be applied. Our recent results show remarkable structural quality of GaN grown on He implanted Si in that are no cracks and grain diameter is comparable to that observed for samples grown on $Al_2O_3$, despite the large lattice mismatch and differences in thermal expansion coefficient.

REFERENCES

Reference to one or more of the following publications may provide context and/or assist in a better understanding of the invention described and claimed herein. Pertinent portions of the following references as cited herein are incorporated by reference:

[1]. A. Dadgar, F. Schulze, M. Wienecke, A. Gadanecz, J. Blasing, P. Veit, T. Hempel, A. Diez, J. Christen, and A. Krost, New J. Phys. 9 (2007) 387.

[2]. A. Dadgar, M. Poschenrieder, J. Blasing, O. Contreras, F. Bertman, T. Riemann, A. Reiher, M. Kunze, I. Daumiller, A. Krtschil, A. Diez, A. Kaluza, A. Modlich, M. Kamp, J. Christe,. F. A. Ponce, E. Kohn, and A. Krost, J. Crystal Growth 248 (2003) 556.

[3]. A. Krost, A. Dadgar, F. Schulze, J. Blasing, G. Strasburger, R. Clos, A. Diez, P. Veit, T. Hempel, and J. Christen, J. Crystal Growth 275 (2005) 209.

[4]. S. Fang, K. Adomi, S. Iyer, H. Morkoç, H. Zabel, C. Choi and N. Otsuka, J. Appl. Phys. Rev., 68 (1990) R31.

[5]. A. Sakai, H. Sunakawa, and A. Usui, Appl. Phys. Lett. 71,(1997) 2259.

[6]. Z. Liliental-Weber, M. Benamara, W. Swider, J. Washburn, J. Park, P. A. Grudowski, C. J. Eiting, and R. D. Dupuis, MRS Internet J. Nitride Semicond. Res. Res. 4S1 (1998) G4.6.

[7]. Z. Liliental-Weber and D. Cherns, J. Appl. Phys. 89 (2001) 7833.

[8]. T. Zheleva, S. Smith, D. Thomson, K. Linthicum, P. Rajagopal, and R. F. Davis, J. Electr. Mat. 28 (4) (1999) L5.

[9]. P. Fini, H. Marchand, J. P. Ibbetson, B. Moran, L. Zhao, S. P. Denbaars, J. S. Speck, and U. Mishra, Mater. Res. Soc. Symp. Proc. 572,(1999) 315.

[10]. R. F. Davis, T. Gehrke, K. J. Linthicum, T. S. Zhelewa, E. A. Preble, P. Rajagopal, C. A. Zorman, and M. MehreganY, J. Crystal Growth 225,(2001) 134.

[11]. H. Trinkaus, B. Holander, St. Rongen, S. Mantl, H. J. Herzog, J. Kuchenbeckern and T. Hackbarth, Appl. Phys. Lett. 76 (2000) 3552.

[12]. M. Luysberg, D. Kirch, H. Trnkaus, B. Hollander, St. Lenk, S. Mantl, H. J. Hertzog, T. Hackbarth, P. F. P. Fichtner, J. Appl. Phys., 92 (2002) 4290.

[13]. Karen A. Reinhardt, Werner Kern in "Handbook of silicon wafer cleaning technology" 2nd edition, Publisher: Elsevier Science & Technology Book, January 2008, ISBN-13: 9780815515548

[14]. N. Miller, R. E. Jones, J. W. Ager, K. M. Yu, Zuzanna Liliental-Weber, P. Flanigan, J. Wu, E. E. Haller, W. Walukiewicz, T. Williamson, and M. A. Hoffbauer, "Low-temperature grown compositionally graded InGaN films Phys. Stat. Sol (C) , Vol. 5,No. 6, 1866-1869,(2008).

[15]. Wei-Kan Chu, James W. Mayer, Marc-A. Nicolet, *Backscattering Spectrometry,*(Academic Press Inc., New York, 1978).

[16]. P. F. P. Fichtner et al., *Nucl. Instr. and Meth. in Phys. Res.,*B 136-138 (1998) 460.

[17]. J. F. Ziegler, J. P Biersack and U. Littmark, *The Stopping and Range of Ions in Solids,*(Pergamon Press, Oxford, 1985), Vol. 1.

[18]. F. Semond, B. Damilano, S. Vezian, N. Grandjean, M. Lerous, and J. Massies, Appl. Phys. Lett. 72 (1992) 82.

CONCLUSION

Misfit dislocations are redirected from the buffer/Si interface and propagated to the Si substrate due to the formation of bubbles in the substrate. The buffer layer growth process is generally a thermal process that also accomplishes annealing of the Si substrate so that bubbles of the implanted ion species are formed in the Si at an appropriate distance from the buffer/Si interface. In this way the bubbles will not migrate to the Si surface during annealing, but are close enough to the interface so that a strain field around the bubbles will be sensed by dislocations at the buffer/Si interface and dislocations are attracted by the strain field caused by the bubbles and move into the Si substrate instead of into the buffer epi-layer. Fabrication of improved integrated devices based on GaN (including GaN, InGaN or AlGaN) grown on Si, such as continuous wave (CW) lasers and light emitting diodes, at reduced cost is thereby enabled.

Although the foregoing invention has been described in some detail for purposes of clarity of understanding, certain changes and modifications will be apparent to those of skill in the art. It should be noted that there are many alternative ways of implementing both the process and compositions of the present invention. Accordingly, the present embodiments are to be considered as illustrative and not restrictive, and the invention is not to be limited to the details given herein.

The invention claimed is:

1. A method of fabricating a GaN-based semiconductor device substrate, comprising:
    implanting a Si substrate with an ion species capable upon annealing of forming bubbles;
    after the implantation, cleaning the Si surface using conditions that do not cause dissipation of the implanted ions or bubbles formed therefrom to the Si substrate surface;
    growing a GaN/Si buffer layer on the cleaned Si substrate with a thermal treatment so that a buffer/Si interface is formed, and whereby annealing of the Si substrate is also effected so that bubbles of the implanted ion species are formed in the Si at an appropriate distance from the buffer/Si interface so that the bubbles will not migrate to the Si surface during annealing, but are close enough to the interface so that a strain field around the bubbles will be sensed by dislocations at the buffer/Si interface such that the dislocations are attracted by the strain field caused by the bubbles and move into the Si substrate instead of into the buffer layer; and
    growing a layer of GaN, or other III-Nitride based on GaN, such as InGaN or AlGaN, on the buffer layer.

2. The method of claim 1, wherein The method of claim 1, wherein the ionic species is selected from the group consisting of He, N and H.

3. The method of claim 1, wherein the ionic species is He.

4. The method of claim 3, wherein the GaN/Si buffer layer is an AlN layer.

5. The method of claim 4, wherein the implant and anneal is conducted such that the He bubbles form about 100-250 nm from the AlN/Si interface.

6. The method of claim 2, wherein the Si surface clean is conducted at a temperature below 300° C.

7. The method of claim 6, wherein the Si surface clean is a wet chemical clean conducted at a temperature of about 80° C.

8. The method of claim 7, wherein the Si surface clean is without a thermal anneal following the wet chemical clean and before growing the buffer layer.

* * * * *